United States Patent [19]

Rottner et al.

[11] Patent Number: 5,902,117

[45] Date of Patent: May 11, 1999

[54] PN-DIODE OF SIC AND A METHOD FOR PRODUCTION THEREOF

[75] Inventors: Kurt Rottner; Adolf Schöner, both of Kista; Mietek Bakowski, Skultuna, all of Sweden

[73] Assignee: ABB Research Ltd., Zurich, Switzerland

[21] Appl. No.: 08/859,844

[22] Filed: May 21, 1997

[51] Int. Cl.$^6$ .............................. H01L 21/00; H01L 23/58
[52] U.S. Cl. ................... 438/105; 438/931; 438/522; 438/548; 257/77; 257/493; 257/653
[58] Field of Search ....................... 438/105, 931, 438/237, 482, 483, 484, FOR 156, FOR 260, FOR 415, 522, 548; 257/77, 101, 471, 472, 653, 654, 487, 493, 492

[56] References Cited

U.S. PATENT DOCUMENTS

| | | | |
|---|---|---|---|
| 4,153,904 | 5/1979 | Tasch, Jr. et al. ....................... | 257/493 |
| 4,305,085 | 12/1981 | Jaecklin et al. .......................... | 257/493 |
| 4,771,011 | 9/1988 | Hemmah et al. ........................ | 438/328 |
| 4,774,560 | 9/1988 | Coe ......................................... | 257/493 |
| 5,318,915 | 6/1994 | Baliga et al. ............................ | 438/931 |
| 5,432,360 | 7/1995 | Kim et al. ................................ | 257/104 |
| 5,674,765 | 10/1997 | Rottner ..................................... | 438/523 |
| 5,710,059 | 1/1998 | Rottner ..................................... | 438/105 |
| 5,801,836 | 9/1998 | Bakowski et al. ........................ | 257/77 |
| 5,804,483 | 9/1998 | Harris ....................................... | 438/931 |

FOREIGN PATENT DOCUMENTS

| | | |
|---|---|---|
| WO 97/36317 | of 1997 | WIPO . |
| WO 97/36318 | of 1997 | WIPO . |

OTHER PUBLICATIONS

Troffer et al., Doping of SiC by Implantation of Boron and Aluminum, Phys. Stat. Sol., vol. 162, No. 277, 1997, pp. 289–293, p. 296 Abstract.

Kalinina et al., Electrical Properties of P–N Junctions Formed by Ion Implantation, Soviet Phys. Semicond. 12 (12), Dec. 1978, pp. 1372–1374.

Sonntag et al., Ion–Implantation Doping of Crystalline 6H–SiC, Appl. Phys. A 61, 1995, pp. 363–367.

Ramungul et al., Comparison of Aluminum– and Boron– Implanted Vertical 6H–SiC P–N Junction Diodes, Inst. Phys. Conf. Ser. No. 142, Chap. 4, 1995, pp. 713–716.

Addamiano et al., Ion–Implantation Effects of Nitrogen, Boron, and Aluminum in Hexagonal Silicon Carbide, Journal of Electrochemical Society, Solid–State Science and Technology, 1972, pp. 1355–1361.

Shenoy et al., Planar, Ion Implanted, High Voltage 6H–SiC P–N Junction Diodes, IEEE Electron Device Letters, vol. 16, No. 10, Oct. 1995, pp. 454–456.

Rao et al., Al, Al/C and Al/Si Implantations in 6H–SiC, Journal of Electronic Materials, vol. 25, No. 1, 1996, pp. 75–80.

Mehrotra et al., Comparison of High Voltage Power Rectifier Structures, 5th International Symposium on Power Semiconductor Devices and ICs, IEEE 1993, pp. 199–204.

Pensl et al., Electrical Properties of Silicon Carbide Polytypes, Inst. Phys. Conf. Ser, No. 142, Chap. 2, 1995, pp. 275–280.

(List continued on next page.)

*Primary Examiner*—Michael Trinh
*Attorney, Agent, or Firm*—Pollock, Vande Sande & Amernick

[57] ABSTRACT

A pn-diode of SiC has a first emitter layer part doped with first dopants having a low ionization energy and a second part designed as a grid and having portions extending vertically from above and past the junction between the drift layer and the first part and being laterally separated from each other by drift layer regions for forming a pn-junction by the first part and the drift layer adjacent such portions at a vertical distance from a lower end of the grid portions. The different parameters of the device are selected to allow a depletion of the drift layer in the blocking state form a continuous depleted region between the grid portions, to thereby screen off the high electric field at the pn-junction so that it will not be exposed to high electrical fields.

15 Claims, 2 Drawing Sheets

OTHER PUBLICATIONS

Ghezzo et al., Boron–Implanted 6H–SiC Diodes, Appl. Phys. Lett. 63 (9), Aug. 1993, pp. 1206–1208.

Rao et al., P–N Junction Formation in 6H–SiC by Acceptor Implantation into N–Type Substrate, Nuclear Instruments and Methods in Physics Research B 106, 1995, pp. 333–338.

Rao et al., A1 and B Ion–Implantations in 6H– and 3C–SiC, Jour. Appl. Phys. 77 (6), Mar. 1995, pp. 2479–2485.

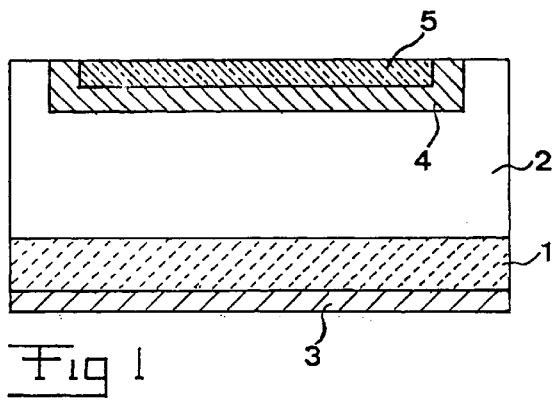
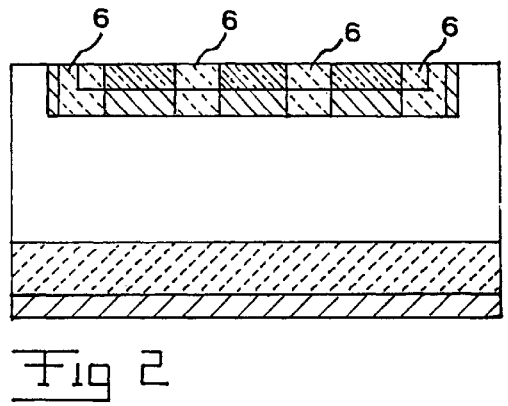
Fig 1
Fig 2
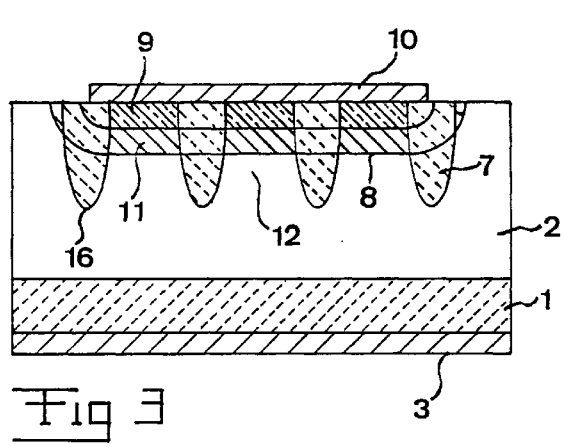
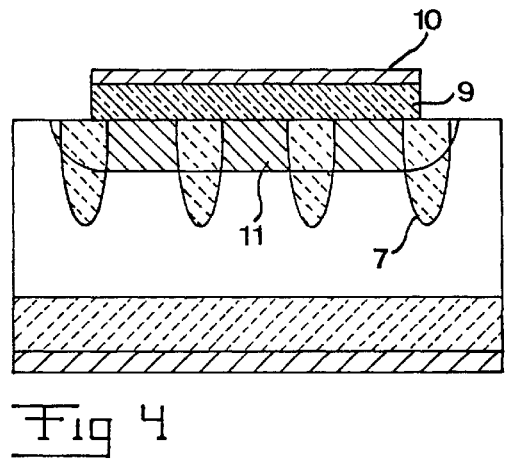
Fig 3
Fig 4
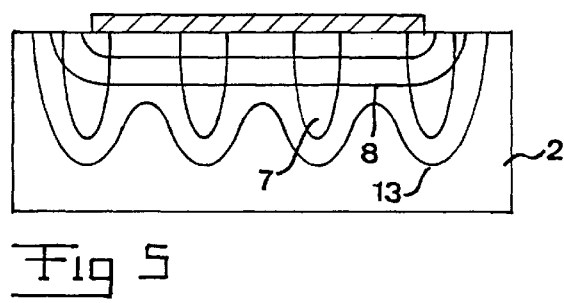
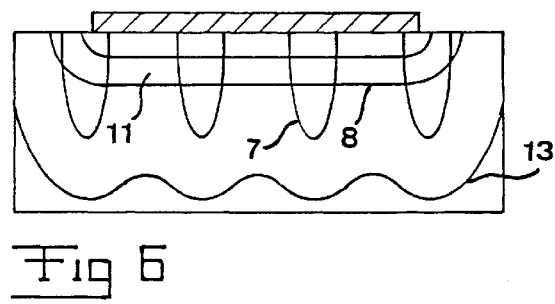
Fig 5
Fig 6

PN-DIODE OF SIC AND A METHOD FOR PRODUCTION THEREOF

TECHNICAL FIELD

The present invention relates to a pn-diode having on top of each other in the order mentioned the following layers of SiC: a highly-doped n-type substrate layer, a low-doped n-type drift layer and a doped p-type emitter layer, as well as a method for producing such a diode.

BACKGROUND OF THE INVENTION

SiC has some excellent physical properties, such as a high thermal stability, that devices fabricated from SiC are able to operate at high temperatures, namely up to 1,000° K., a high thermal conductivity, so that SiC devices may be arranged at a high spatial density, and a high breakdown field being approximately ten times higher than for Si. These properties make SiC very suited as material for high power devices operating under conditions where high voltages may occur in the blocking state of the device. However, most dopants have a very low diffusivity in SiC, so that it will be desired to use the implantation technique for forming the p-type emitter layer in a pn-diode of SiC. This means in turn that the pn-junction of the diode will be located in a region of the device damaged by the implantation unless dopants having a comparatively high diffusivity in SiC are used for the implantation, so that the pn-junction may be spatially separated from implantation damage. A location of the pn-junction in the damaged region would result in a higher leakage current and thus bad reverse characteristics of the diode. However, it is also desired to dope the emitter layer with dopants having a low ionization energy so as to obtain a low forward voltage drop and by that good forward characteristics of the device. There are no acceptor candidates for SiC combining these two characteristics desired.

SUMMARY OF THE INVENTION

The object of the present invention is to provide a diode according to the introduction, which solves the problem discussed above by combining good reverse characteristics and good forward voltage drop, as well as a method for production thereof.

This object is obtained by providing a diode, in which the emitter layer comprises a first part highly doped with first dopants having a low ionization energy and a second part designed as a grid and having portions extending vertically from above and past the junction between the drift layer and the first part and being laterally separated from each other by drift layer regions for forming a pn-junction by first part and the drift layer between adjacent such portions at a vertical distance from a lower end of the grid portions. The doping concentrations of the drift layer and the grid portions, the depths of the grid portions with respect to the location of the pn-junction and the lateral distance between the grid portions are selected to allow a depletion of the drift layer in the blocking state form a continuous depleted region between the grid portions and thereby screening off the high electrical field at the pn-junction formed by the first emitter layer part and the drift layer, which thus will not be exposed to high electrical fields.

By forming the emitter layer of the two parts the first dopants having a low ionization energy and by that a high emitter efficiency determine the forward conduction characteristics of the diode and result in a low forward voltage drop at high current densities, while the second part of the emitter layer constituted by the grid portions will pinch the volume between that portions and ensure that the electric field is low at the pn-junction formed by the first emitter layer part and the drift layer, where the device is damaged by the implantation and by that decrease the leakage current remarkably. Thus, such a diode will have excellent properties in the forward conducting state as well as in the blocking state thereof.

According to a preferred embodiment of the invention the second part is doped with second dopants having a higher diffusivity in SiC than the first dopants of the first part. This means that it will be possible to form the emitter structure of the diode by implantation followed by an annealing step making it possible to form the grid portions by a diffusion of the second dopants deeper into the drift layer than the first dopants. Thus, it will be possible to take advantage of the first dopants having a low ionization energy resulting in a high emitter efficiency in the forward state of the diode and still obtain the pn-junction spatially separated from implantation damage when the diode is reverse biased. Accordingly, it will be possible to use dopants having a high ionization energy as the second dopants, which further improves the reverse characteristics of the diode, and a further preferred embodiment of the invention is based on this characteristics.

According to another preferred embodiment of the invention the second part is doped with dopants that may be implanted deeply into a SiC-layer without causing severe damage to the SiC-layer. Also this embodiment makes it possible to keep the high electric fields away from regions damaged by implantation in the blocking state and obtain a low forward voltage drop at higher current densities in the forward state.

According to another preferred embodiment of the invention the diode comprises trenches etched from above at least partially into the first part of the emitter layer, and the grid portions are formed in the bottom of the trenches. This makes possible obtaining a large vertical distance between the pn-junction and the lower end of the emitter portions making it easier to keep the pn-junction in the blocking state of the device far away from the first emitter layer part.

According to another preferred embodiment of the invention the first part of the emitter layer is doped with aluminium. Aluminum has a low ionization energy and a high emitter efficiency also at high current densities making it well suited as dopant for the first part of the emitter layer.

According to another preferred embodiment of the invention the second part of the emitter layer is doped with boron. Boron has a comparatively high diffusivity in SiC, which makes it well suited for use in forming the grid portions by an annealing step after implantation, and it has a high ionization energy resulting in a comparatively bad emitter efficiency, especially at higher current densities, making it badly suited as dopant for the entire emitter layer.

The combination of aluminum as dopant of the first part of the emitter layer and boron as dopant of the grid portions of the emitter layer results in a very attractive pn-diode. In such a diode the forward conduction characteristics is determined by the high emitter efficiency of aluminum. With increasing reverse voltage the boron-doped grid portions act more and more like a homogeneous doped layer determining the reverse characteristics of the device and maintaining the electrical field low at the Al pn-junction, where implantation damages exist. In forward conduction mode the boron-doped grid portions act as additional emitter area until at higher current densities the emitter efficiency thereof starts to decrease, but the aluminum-doped emitter layer part is still active, maintaining a low forward voltage drop. A diode having such a structure may easily be produced by implantation followed by an annealing step thanks to the different diffusivities of aluminum and boron in SiC.

The object of the invention is also obtained by providing a method for producing a pn-diode in SiC comprising the steps of:

1) epitaxially growing on top of a highly doped n-type substrate layer of SiC a low doped n-type drift layer of SiC,
2) applying a p-type first emitter layer part being highly doped with first dopants having a low ionization energy on top of the drift layer,
3) introducing second p-type dopants into the drift layer in regions laterally spaced for forming a grid of second emitter layer portions in the drift layer with a lower end thereof at a vertical distance from a pn-junction formed therebetween by first emitter layer parts separating the portions and the drift layer, wherein the doping concentrations of the drift layer and the grid portions, the depths of the grid portions with respect to the location of the pn-junction and the lateral distance between the grid portions are selected to allow a depletion of the drift layer in the blocking state form a continuous depleted region between the grid portions and thereby screening off the high electrical field at the pn-junction, which thus will not be exposed to high electrical fields.

It will in this way be possible to produce a pn-diode of SiC having the characteristics aimed at and adherent to the diodes according to the different preferred embodiments of the invention described above.

According to another preferred embodiment of the invention the method is characterized in that the first emitter layer part is in step 2) applied by implanting the dopants having a low ionization energy into the drift layer grown in step 1), and in step 3) second dopants having a high diffusivity in SiC are introduced by implanting them into the drift layer grown in step 1) in regions laterally separated from each other, and step 3) also comprises an annealing of the implanted regions at such a high temperature that the second dopants diffuse further into the drift layer than the first dopants for forming the second emitter layer portions at a vertical distance from the pn-junction.

By implanting dopants having a high diffusivity in SiC into the drift layer in this way it will be possible to form the preferred grid structure by the following annealing step thus rendering the pn-junction in the blocking state of the diode well spatially separated from implantation damages.

According to another preferred embodiment of the inventive method further comprises a step of:

4) etching trenches from above into the drift layer at locations where the second emitter layer portions are to be formed before carrying out step 3), and in step 3) the second dopants are introduced into at least the bottom of the trench for forming the emitter layer portions forming the grid. "Trench" is here to be interpreted broadly and may have an elongated extension as a line as well as a pocket extension like a dot.

This etching step followed by introduction of the second dopants into the bottom of the trench makes it possible to obtain a large vertical distance between the lower end of the grid portions and the first emitter layer part.

Further preferred characteristics and advantages of the invention will appear from the following description and the other dependent claims.

BRIEF DESCRIPTION OF THE DRAWINGS

With reference to the appended drawings below follows a specific description of preferred embodiments of the invention cited as examples.

In the drawings:

FIGS. 1–3 illustrate some of the steps used in a method for producing a pn-diode of SiC according to a first preferred embodiment of the invention illustrated in FIG. 3, FIG. 4 schematically illustrates a diode according to a second preferred embodiment of the invention, FIG. 5 is a very schematic view illustrating the upper part of the diode according to FIG. 3 in the blocking mode with a low blocking voltage applied thereon illustrating the depletion region separating the pn-junction from the first emitter layer part, FIG. 6 is a view corresponding to FIG. 5 of the diode having a high blocking voltage applied thereon.

DETAILED DESCRIPTION OF PREFERRED EMBODIMENTS

Figure 7:
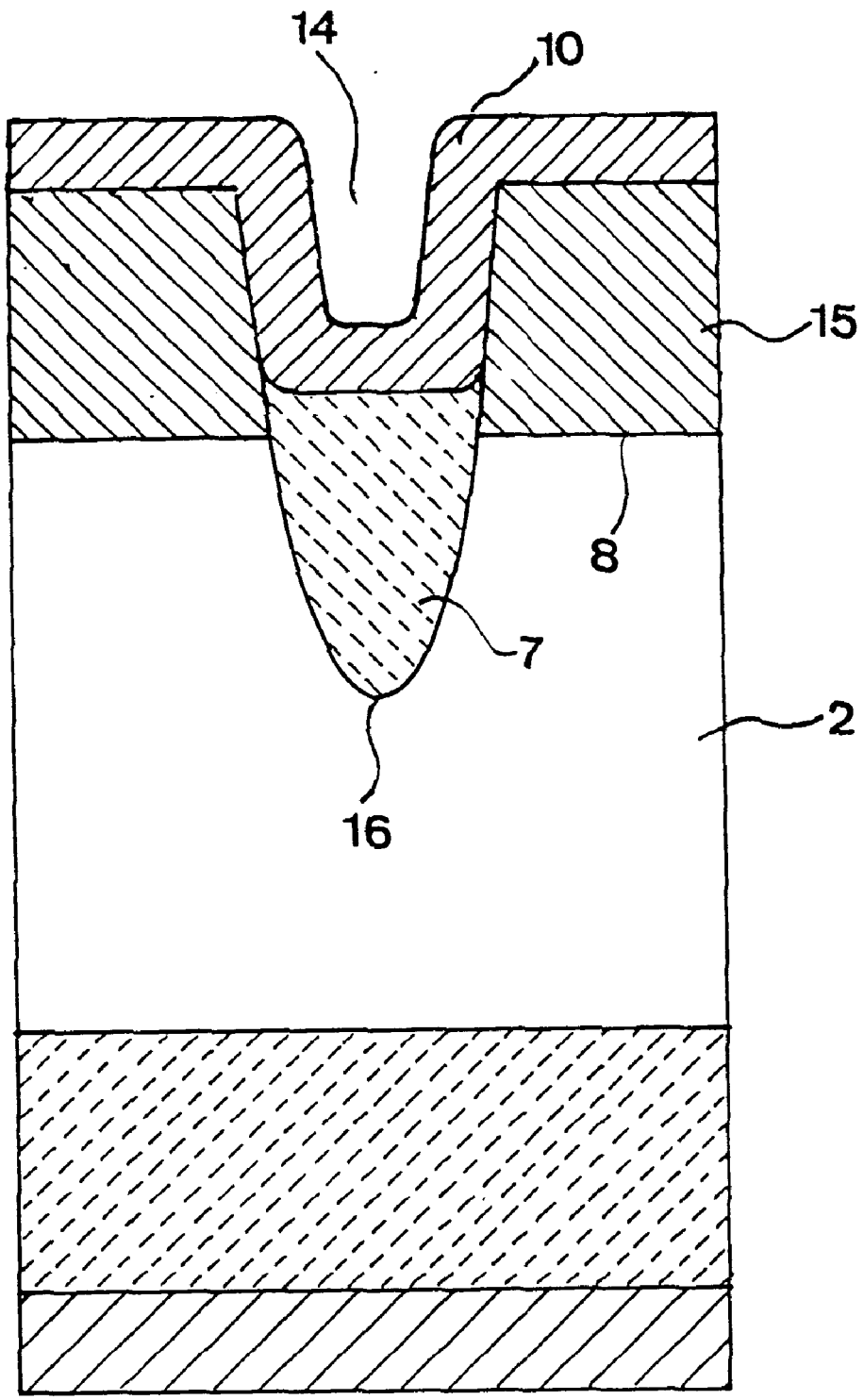
FIG. 7 is a schematic, enlarged view of a part of a diode according to a third preferred embodiment of the invention.

First of all, it has to be pointed out that the relative dimensions of the regions in the different devices illustrated in the figures have only been chosen for the sake of clarity of the drawings, and they may be quite different, and that several further conventional processing steps, such as masking and demasking, having nothing to do with the invention have been left out in the figures.

FIG. 1 illustrates how a highly doped n-type substrate layer 1 and a low doped n-type drift layer 2 have been epitaxially grown on top of each other, preferably by using the Chemical Vapor Deposition (CVD) technique. A contact layer 3 making a good ohmic contact to the substrate layer 1 has been applied to the latter. Furthermore, aluminum has been implanted into the drift layer 2 in two steps for producing a highly doped p++ layer 4 on top of a layer 5 of a little bit lower doping concentration obtained by using higher implantation energies.

A mask (not shown) is after that patterned with openings in lines or dots or any other geometry, and then boron ions are implanted into the layers 4 and 5 through these openings for forming laterally spaced regions 6 being doped by boron.

An annealing step is after that then carried out at a high temperature, in the order of 1,300–1,700° C., which makes the boron diffuse into the drift layer to form grid portions 7 having the lower end thereof vertically well separated from the lower border 8 of the first emitter layer part formed by the aluminum-doped regions between the grid portions. It is emphasized that boron may be deeper implanted than aluminum from the beginning by using higher implantation energy. The first emitter layer part having a highly doped contact sub-part 9 with a doping concentration in the range of $10^{20}$ cm$^{-3}$ making a good ohmic contact to a contact layer 10 and another sub-part 11 located thereunder having a doping concentration of about $10^{19}$ cm$^{-3}$. The thickness of the first emitter layer part formed by the sub-parts 9 and 10 may be in the range of 0.5–1 μm, whereas the grid portions 7 may have a depth of approximately 2 μm measured from the contact layer 10. The spacings between two adjacent grid portions may be in the order of 2–3 μm and the doping concentration in the grid portions 7 may typically be $5 \times 10^{17} - 5 \times 10^{18}$ cm$^{-3}$.

A diode according to a second preferred embodiment of the invention being similar to that illustrated in FIG. 3 as to the function is illustrated in FIG. 4, and it only differs from that in FIG. 3 by the fact that the sub-part of the first emitter layer part making a good ohmic contact with the contact layer 10 is formed by a step of regrowth of an aluminum-doped layer by CVD after forming the second emitter layer part 11 and the grid portions 7 by implantation. The contact layer 10 may also be left out.

The function of a diode of the type described above and illustrated in FIGS. 3 and 4 will now be explained, and it is noticed that it has a behavior reminding of that of a JBS (Junction Barrier Schottky Diode). In the forward conduction state of the device the characteristics is determined by the high emitter efficiency of aluminum in the first emitter layer part 9, 11, and the boron-doped grid portions 7 act as additional emitter area until, at higher current densities, the emitter efficiency of these proportions start to decrease. However, the aluminum-doped emitter layer part is still active, maintaining a low forward voltage drop. The emitter efficiency of Al is approximately about twice as high as for B also at higher current densities. When the device is in the blocking mode the regions 12 of the drift layer located between the grid portions 7 are depleted, so that the electric field will be kept low at the Al-pn-junction. Thus, the electric field will be high where the quality of the structure is high and low where the quality is lower resulting in low leakage currents in the blocking mode. The blocking voltage is low in FIG. 5, and it is illustrated how the p-doped grid portions act nearly like a homogeneous layer with increasing blocking voltage determining the reverse characteristics of the device.

It is illustrated in FIG. 7 how a trench 14 may be etched by an etching process, preferably a dry etch (RIE), from above into the drift layer or more exactly at least partially into the first emitter layer part 15, at the location where the grid portions are to be created. These trenches may be lines or dots. The grid portions 7 are in this case created by implanting the second dopants, preferably boron, into the bottom of the trench and then carrying out an annealing step for diffusion of the dopants further into the drift layer for obtaining a comparatively large vertical distance between the lower end 16 of the respective grid portion and the border 8 of the first emitter layer part located next thereto. After that the contact layer 10 may be applied in a conventional way. The method includes of course further steps, such as masking, patterning and demasking, not described here. FIG. 7 only shows a part of the diode, and also in this case grid portions 7 are arranged at lateral intervals.

The invention is of course not in any way restricted to the embodiment described above, but several possibilities of modifications thereof would be apparent to a person ordinarily skilled in the art without departing from the basic idea of the invention.

The number of layers mentioned in the claims is a minimum number, and it is within the scope of the invention to arrange further layers in the devices or dividing any layer into several layers by selective doping of different regions thereof. Especially the drift layer may be composed by sub-layers of different doping concentrations, such as particularly low doping concentrations close to the emitter layer regions for fascilitating the depletion of the drift layer there.

"Substrate layer" is in this disclosure to be interpreted as the layer closest to the cathode of the layers mentioned and it has not to be a substrate layer in the strict sense of this word within this field, i.e. the layer from which the growth is started. The real substrate layer may be any of the layers and is mostly the thickest one, which may be the drift layer.

The definition "epitaxially growing on top of each other . . . substrate layer" in the claims and in the description comprises also the case in which the epitaxial growth is started by growing on top of a substrate disc. However, the very substrate does not have to be grown epitaxially.

The method claims are to be interpreted as not restricted to a growth of the layers located on top of each other in the order they are mentioned, but any other order of growth of these layers is within the scope of the claims. For instance, a method may be started from the drift layer and the so-called substrate layer and the cathode may be grown at the very end of the method.

It would also be possible to produce the entire first emitter layer part by epitaxial growth, preferably a regrowth after implanting the second dopants for forming the grid portions, but is also possible to first growth said first emitter layer part and then implant the second dopants or forming the grid portions.

"2) applying . . . on top of the drift layer" in the independent method claim of course also comprises the case shown in the figures in which regions of the drift layer also surround the first emitter layer part laterally.

We claim:

1. A pn-diode having on top of each other in the order mentioned the following layers of SiC: a highly-doped n-type substrate layer, a low-doped n-type drift layer (2) and a doped p-type emitter layer, characterized in that the emitter layer comprises a first part being highly doped with first dopants having a low ionization energy and a second part designed as a grid and having portions extending vertically from above and past a junction between the drift layer and the first part and being laterally separated from each other by drift layer regions for forming a pn-junction by said first part and the drift layer between adjacent such portions at a vertical distance from a lower end of said grid portions, and that doping concentrations of the drift layer and said grid portions, depths of said grid portions with respect to the location of said pn-junction and the lateral distance between said grid portions are selected to allow a depletion of the drift layer in a blocking state form a continuous depleted region between the grid portions and thereby screening off an electrical field at the pn-junction, which by this will not be exposed to the electrical field.

2. A diode according to claim 1, characterized in that said second part is doped with dopants having a higher diffusivity in SiC than said first dopants of the first part.

3. A diode according to claim 1, characterized in that the second part is doped with dopants that are implanted deeply into a SiC-layer without causing severe damage to said SiC-layer.

4. A diode according to claim 1, characterized in that the dopants of said second part have a high ionization energy.

5. A diode according to claim 1, characterized in that it comprises trenches etched from above at least partially into said first part of the emitter layer, and that said grid portions are formed in the bottom of the trenches.

6. A diode according to claim 1, characterized in that the first part of the emitter layer is doped with aluminum.

7. A diode according to any of claim 1, characterized in that the second part of the emitter layer is doped with boron.

8. A method for producing a pn-diode of SiC comprising the steps of:

1) epitaxially growing on top of a highly doped n-type substrate layer of SiC a low doped n-type drift layer of SiC, 2) applying a p-type first emitter layer part being highly doped with first dopants having a low ionization energy on top of the drift layer, 3) introducing second p-type dopants into the drift layer in regions laterally spaced for forming a grid of second emitter layer portions in the drift layer with a lower end thereof at a vertical distance from a pn-junction formed therebetween by first emitter layer parts separating the portions and the drift layer, doping concentrations of the drift layer and said grid portions, depths of the grid portions with respect to the location of the pn-junction and the lateral distance between grid portions being selected to allow a depletion of the drift layer in a blocking state form a continuous depleted region between the grid portions and thereby screening off an electrical field at the pn-junction, which by this will not be exposed to the electrical field.

9. A method according to claim 8, characterized in that said first emitter layer part is in step 2) applied by implanting the dopants having a low ionization energy into the drift layer grown in step 1), and that in step 3) second dopants having a higher diffusivity in SiC than said first dopants are introduced by implanting them into the drift layer grown in step 1) in regions laterally separated from each other, and that step 3) also comprises an annealing of the implanted regions at such a temperature that the second dopants diffuse further into the drift layer than the first dopants for forming the second emitter layer portions at a vertical distance from the pn-junction.

10. A method according to claim 8, characterized in that it further comprises a step of:

4) etching trenches from above into the drift layer at locations where the second emitter layer portions are to be formed before carrying out step 3), and that in step 3) the second dopants are introduced into at least the bottom of the trench for forming the emitter layer portions forming a grid.

11. A method according to claim 8, characterized in that the introduction in step 3) is carried out by implanting said second dopants into the drift layer at laterally spaced locations, that step 3) is followed by a step of annealing the implanted regions, and that said first emitter layer part is applied in step 2) by epitaxially growing that layer part on top of said second emitter layer portions and said drift layer located therebetween.

12. A method according to claim 8, characterized in that said first emitter layer part is applied in step 2) by epitaxially growing it on top of the drift layer, that second dopants having a higher diffusivity in SiC than said first dopants are in step 3) introduced by implanting them at laterally spaced locations in said first emitter layer part, and that said implantation is followed by a step of annealing implanted regions for making said second dopants to diffuse into the drift layer to a depth at a vertical distance from said pn-junction.

13. A method according to claim 8, characterized in that the second dopants introduced by step 3) have a high ionization energy.

14. A method according to claims 8, characterized in that said second dopants introduced in step 3) are boron.

15. A method according to claims 8, characterized in that said first dopants are aluminum.

* * * * *